United States Patent [19]

Ogawa et al.

[11] Patent Number: 4,812,880
[45] Date of Patent: Mar. 14, 1989

[54] EXPOSURE APPARATUS

[75] Inventors: Kazufumi Ogawa; Masaru Sasago, both of Hirakata; Masayuki Endo, Izumi; Takeshi Ishihara, Neyagawa, all of Japan

[73] Assignee: Matsushita Electric Industrial Co., Ltd., Osaka, Japan

[21] Appl. No.: 67,122

[22] Filed: Jun. 29, 1987

[30] Foreign Application Priority Data

Jul. 2, 1986 [JP] Japan .................................. 61-155346

[51] Int. Cl.$^4$ ..................... G03B 27/54; G03B 27/42
[52] U.S. Cl. .......................................... 355/53; 355/67
[58] Field of Search ............................. 355/43, 45, 53; 356/399–401

[56] References Cited

U.S. PATENT DOCUMENTS

| | | | |
|---|---|---|---|
| 4,458,994 | 7/1984 | Jain et al. | 354/4 |
| 4,653,903 | 3/1987 | Torigoe et al. | 355/53 |
| 4,667,109 | 5/1987 | Kano | 356/401 |
| 4,703,166 | 10/1987 | Bruning | 219/121 LR |

Primary Examiner—L. T. Hix
Assistant Examiner—D. Rutledge
Attorney, Agent, or Firm—Wenderoth, Lind & Ponack

[57] ABSTRACT

Disclosed is an exposure apparatus used in photolithographic process in fabrication of semiconductor devices. More particularly, in an exposure apparatus using an excimer laser, the TTL alignment is achieved by using light with wavelengths of 300 to 400 nm, different from that of excimer laser for exposure, for the purpose of alignment.

10 Claims, 5 Drawing Sheets

EXPOSURE APPARATUS

BACKGROUND OF THE INVENTION

This invention relates to an exposure apparatus used in fabrication of semiconductor devices, and more particularly to a reduction-projective type excimer exposure apparatus which is capable of realizing an ultrafine processing by the technique of photolithography in fabrication of semiconductor devices.

Presently, there are already commercial products of reduction-projective type exposure apparatus (stepper) using a superhigh pressure mercury lamp as the light source for use in fine processing of semiconductor devices, especially LSI and VLSI. In the existing steppers, however, since g-line (435 nm) or i-line (365 nm) of superhigh pressure mercury lamp is used as the light for exposure, the resolution was limited at about 1.2 $\mu$m in g-line and about 0.8 $\mu$m in i-line. At such wavelengths, it is nearly impossible to obtain a resolution of 0.5 $\mu$m that is said to be necessary for fabrication of 4-Mbit DRAM or 16-Mbit DRAM henceforth.

Recently, interests are inclined to the development of exposure apparatus for forming sub-micron pattern using excimer light source, such as XeCl (308 nm), KrF (249 nm) and ArF (193 nm) having shorter wavelengths than g-line or i-line.

However, the reduction-projective exposure using excimer laser involves the following two problems.

(1) The achromatic problem by the half-value width of waveform distribution of the light oscillated by excimer laser beam and the reduction-projective lens (relation between speckle and resolution).

(2) The problem of selection of alignment wavelength.

The first problem may be solved by developing an optical system which can adjust the vertical mode while disturbing the lateral mode of the excimer laser beam, but in the second problem of selection of alignment light, it is preferable to employ a method of directly aligning by the reticle, mask and mark of wafer through a reduction-projective lens by using the same light as the exposure wavelength in order to enhance the alignment precision (which is called the through-the-lens method or TTL method here in after), and it is advantageous in that the lens designing is easy. Never the less, when aligned by using the light of same wavelength as the exposure wavelength, the resist in the alignment key part is exposed during alignment, and the alignment key is broken in the subsequent process. Generally, therefore, in the alignment by TTL method, it was common to use alignment light and exposure wavelength in different regions, for example, conventionally, to use d-line (577 nm) or e-line (546 nm) or Ar laser (515 nm) as alignment light in contrast to the exposure wavelength of g line or i-line of superhigh pressure mercury lamp.

However, when excimer laser light such as KrF (248 nm) is used in the exposure wavelength, lens materials usable in the reduction lens system are limited (practically SiO$_2$ or CaF$_2$), and when the alignment light too different in the wavelength from the exposure wavelength is used, the chromatic aberration cannot be corrected completely, and the resolution is much deteriorated, there by making it impossible to align. That is, it has been discovered that the deviation of d-line (577 nm), e-line (546 nm) of superhigh pressure mercury lamp or Ar laser (515 nm) from the excimer light of exposure wavelength 248 nm is too large to be used in the alignment.

On the other hand, to use the light having the same wavelength as the KrF excimer light source as the alignment light has too many disadvantages as mentioned above.

SUMMARY OF THE INVENTION

It is hence a primary object of this invention to present an exposure apparatus capable of realizing TTL alignment without much deteriorating the optical resolution of the alignment system, if a quartz reduction lens is used, by using a resist for exposure which responds to an excimer light of 200 to 300 nm but does not respond to light of 300 to 400 nm, using, for example, KrF excimer light (that is, 248 nm) as the exposure wavelength, and using light of 300 to 400 nm as the alignment light, such as the light of i-line (365 nm) and j-line (313 nm) of super high pressure mercury lamp or HeCd laser (325 nm).

It is another object of this invention to present a method of realizing alignment by TTL method, for example in an excimer reduction exposure apparatus, even if using a light different from the exposure wavelength as the alignment light. Meanwhile, when using light of 300 to 400 nm as alignment light, if the alignment key, that is, the video camera (CCD camera) for image recognition does not have sensitivity to the light of this wavelength, the alignment precision may be notably improved by inserting an image intensifier (IIT) before the camera, converting the light of 300 to 400 nm wavelength into light in the vicinity of 550 nm, and amplifying about 1000 to 10000 times.

Therefore this invention presents an exposure apparatus capable of aligning the reticle and wafer by direct TTL method, by using, for example KrF (248 nm) excimer light as the light for exposure and i-line or j-line as the alignment light, and converting the alignment light by IIT and then reading the alignment key, for example, by CCD, whereby it is possible to form ultrafine exposure pattern (for example, baking resist pattern of 0.5 to 0.3 nm), and a further high precision alignment (for example 0.1 to 0.05 $\mu$m) may be achieved.

According to the present invention as described here in, the following benefits, among others, are obtained.

In the exposure apparatus of this invention, if KrF excimer light is used as exposure wavelength, a high precision TTL method alignment with alignment precision of about 0.1 to 0.05 $\mu$m is possible, and it is confirmed that a resist pattern of practical resolution level of about 0.4 to 0.5 $\mu$m may be formed sufficiently.

This invention is accordingly very effective henceforth for fabrication of super-super-LSI, such as 16MDRAM and 64MDRAM.

While the novel features of the invention are set forth with particularly in the appended claims, the invention, both as to organization and content, will be better understood and appreciated, along with other objects and features there of, from the following detailed description taken in conjunction with the drawings.

DETAILED DESCRIPTION OF THE INVENTION

Figure 1:
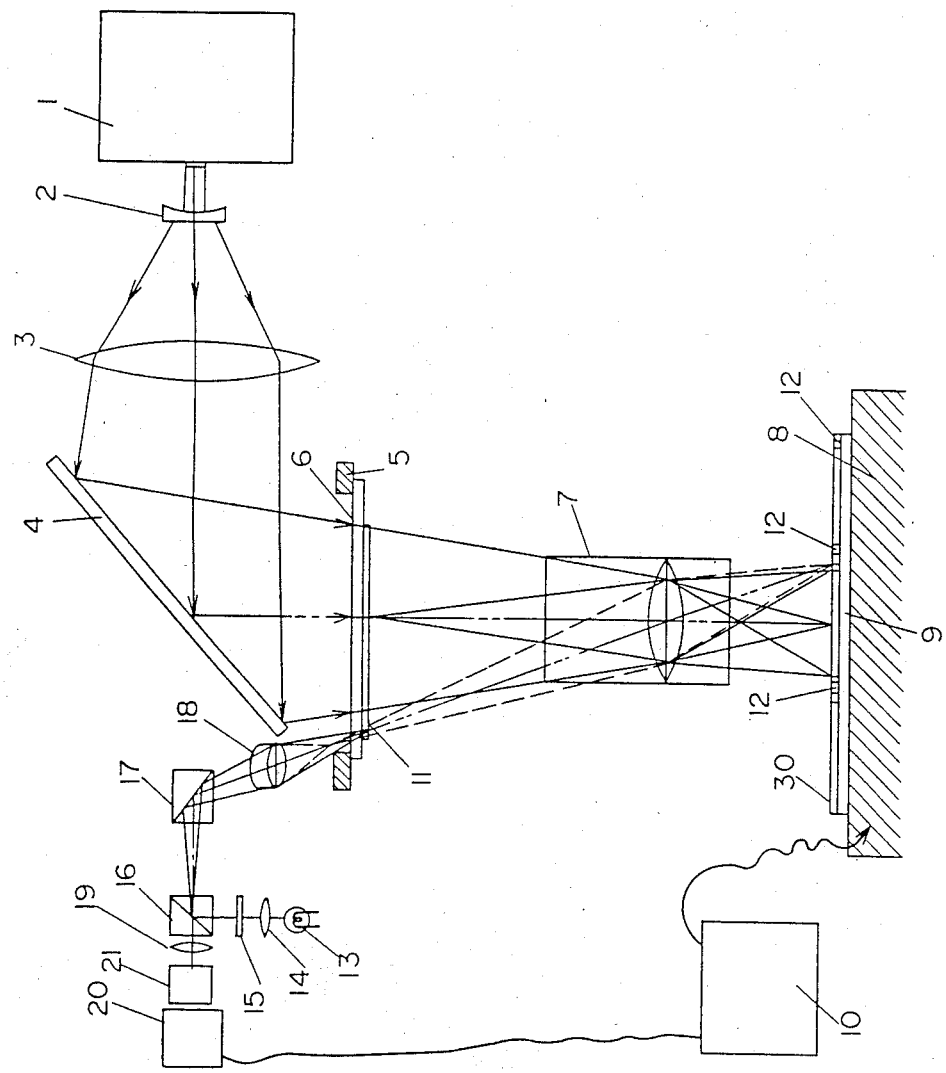
FIG. 1 is a conceptual illustration to explain the concept of an exposure apparatus using an excimer light source of this invention.

Referring now to the drawings, one of the embodiments of exposure apparatus of this invention is described below. In FIG. 1, the light source unit is composed of a KrF excimer light source 1, an integrator 2 for dispersing and emitting the laser beam emitted from the excimer light source 1, a condenser lens 3 for focusing the dispersed light, and a mirror 4 for changing the direction of the optical axis.

On the other hand, the reduction-projective unit is composed of a reticle 6 fixed on a reticle stage 5, a reduction-projective lens 7, and a wafer (semiconductor substrate) 9 fixed on an XY wafer stage 8. On the wafer 9 is formed an alignment key 12 on which a resist 30 is applied.

It is hence composed to fabricate the pattern on the reticle on the wafer by using the excimer light emitted from the light source unit.

Furthermore, the exposure apparatus requires a controlling computer 10 for recognizing the alignment optical system and alignment key, processing the image, and controlling the XY wafer stage 8. That is, it is necessary to match the positions of the alignment key 11 on the reticle and the alignment key 12 on the wafer. In the case of this apparatus, the alignment optical system has HeCd laser or superhigh pressure mercury lamp as the lightsource for alignment 13, and after focusing the light by a focusing lens 14, the light necessary for alignment, for example, only i-line or j-line is picked up by a filter 15 (or monochromator) in the superhigh pressure mercury lamp, or it is directly used in the HeCd laser, and the alignment light is introduced into the alignment optical path by using a beam splitter for alignment 16. Furthermore, by bending the optical axis by prims or mirror 17 or the like, the light is allowed to enter selectively the alignment key 11 on the reticle 6 by using an alignment lens for correction of chromatic aberration and optical path length of the light for exposure (KrF excimer light 248 nm), and HeCd laser, i-line or j-line. In addition, an imaging lens 19 and a CCD camera 20 on the optical axis are disposed so as to recognize, as an image, the light returning after entering the alignment keys 11, 12 and being reflected. At this time, the light returning from the alignment keys 11, 12 as an image is the light in the wavelength of HeCd laser beam, i-line or j-line only, and it is therefore designed to convert it into the light of about 550 nm sensible to the CCD by using IIT 21 and amplify about 1000 to 10000 times.

As the microchannel plate used in the IIT for this wavelength, that is, HeCd laser beam, j-line or i-line, meanwhile, F1217 (manufactured by Hamamatsu Photonics), for example, may be used.

Or as the resist which is applied on the wafer 9 to be exposed to form a pattern, a novolak positive resist may be used by partly modifying.

Figure 2:
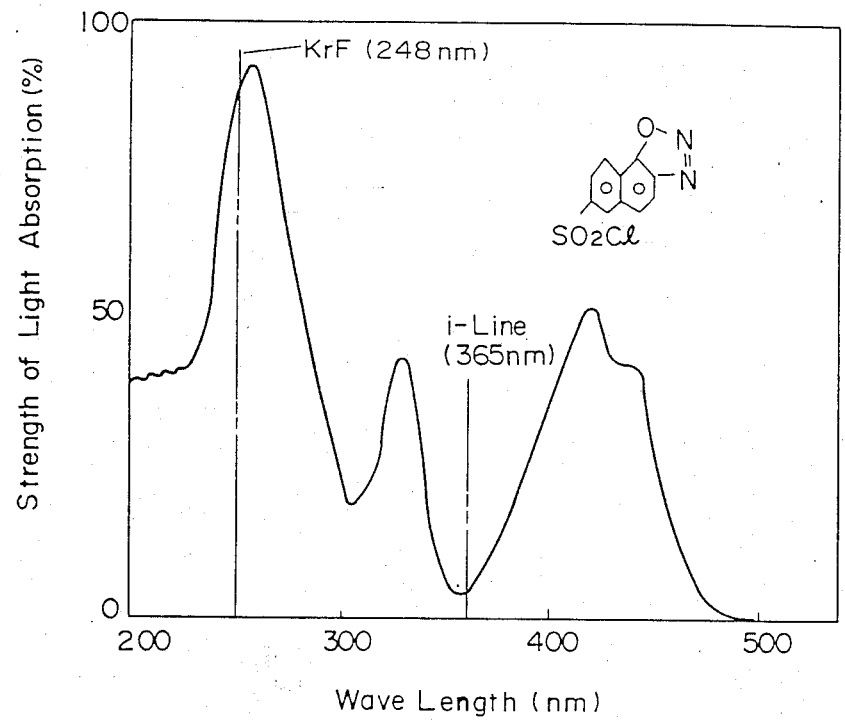
FIG. 2, FIG. 3, FIG. 4 are characteristic diagrams showing the spectral characteristics of photodegradable reagents that can be used in positive resists for alignment of i-line, j-line and HeCd laser beam, respectively.

For example, for i-line alignment, when a naphthoquinone derivative (shown in formula I below) is used on a novolak base polymer, a positive resist possessing sensitivity to light of 248 nm for exposure and very small in absorption in the vicinity of 365 nm may be prepared (of which spectral characteristic is shown in FIG. 2).

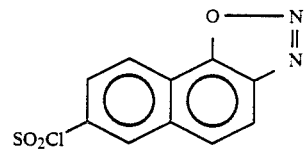

Figure 3:
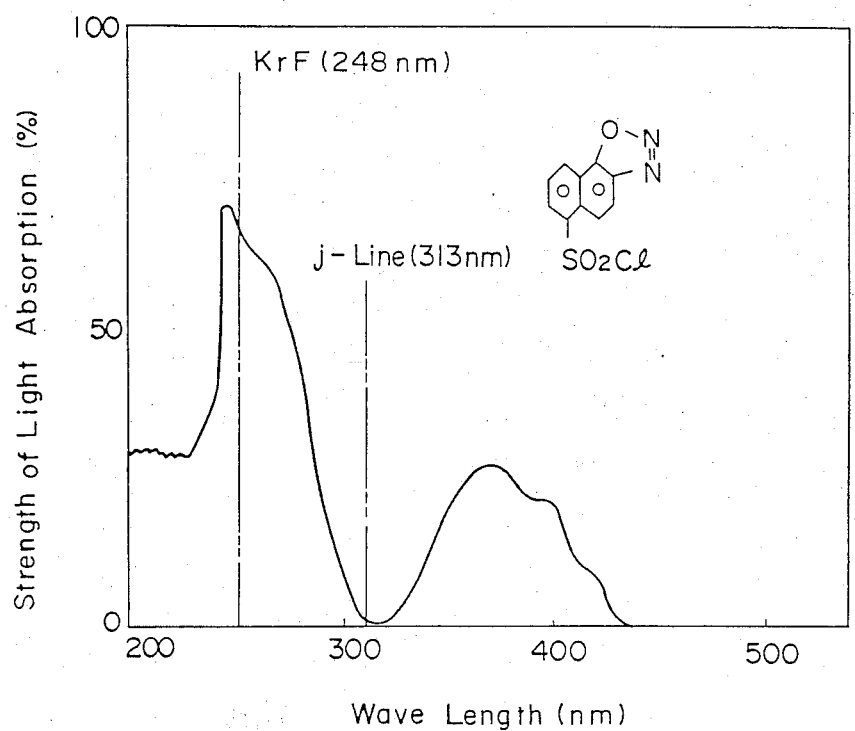

For j-line alignment, when a naphthoquinone derivative (shown in formula II below) is used on a novolak base polymer, a positive resist possessing sensitivity to 248 nm and very small in absorption in the vicinity of 313 nm may be prepared (of which spectral characteristic is shown in FIG. 3).

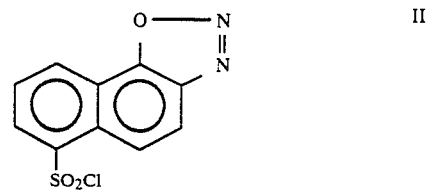

Figure 4:
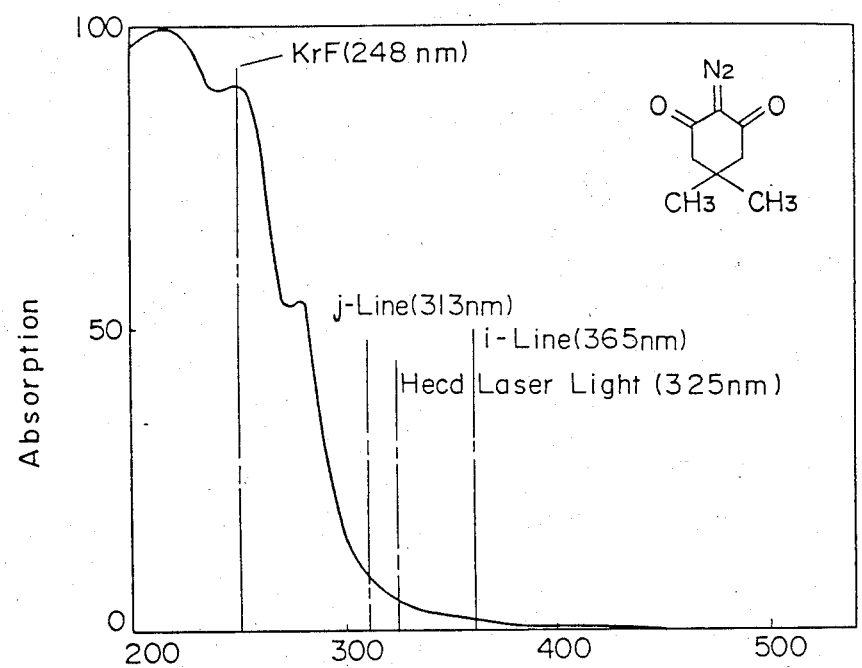

Furthermore, when using i-line, j-line and HeCd laser as alignment light, when 5-diazomerdrum acid or its derivative (shown in formula III below) is used on a base polymer, a positive resist possessing sensitivity to 248 nm and very small in absorption over the whole range of i-line, j-line and HeCd laser may be prepared (of which spectral characteristic is shown in FIG. 4).

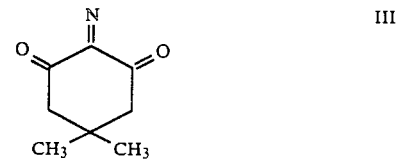

Figure 5:
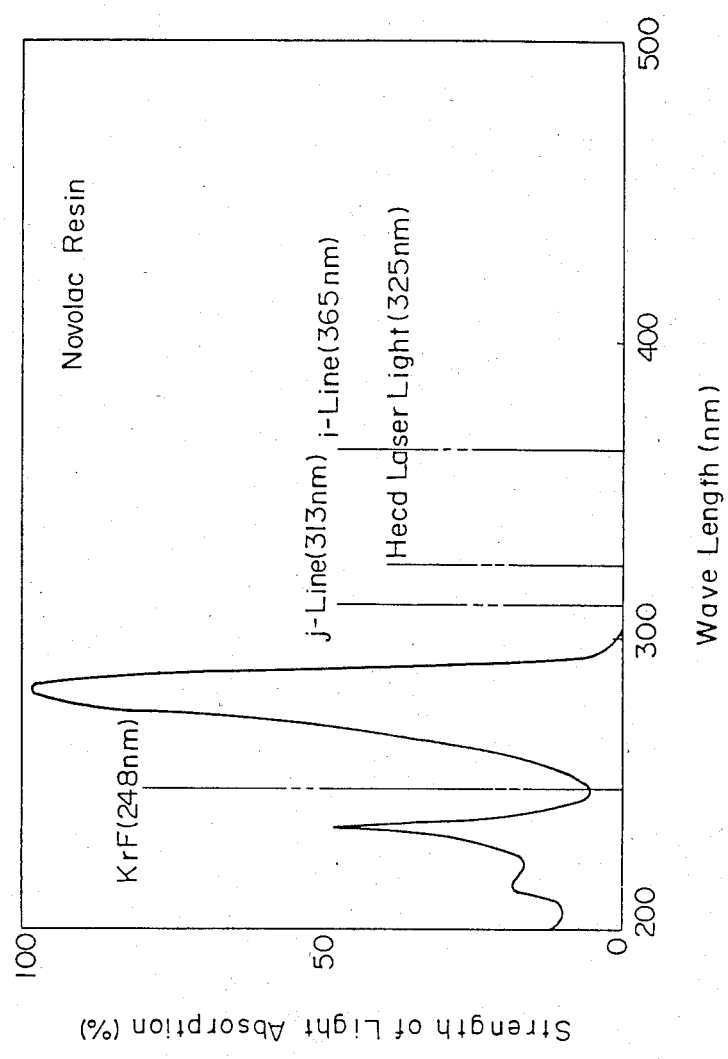
FIG. 5 is a characteristic diagram showing the spectral characteristic of a novolak base polymer.

Meanwhile, as the spectral characteristic of novolak base polymer, a version as shown in FIG. 5 is commercially available. From FIG. 5 it is known that light of 300 to 400 nm can be transmitted sufficiently.

Therefore, in the exposure apparatus of this invention, it is possible to use KrF excimer light with 248 nm as the exposure wavelength, and HeCd laser beam or i-line or j-line of superhigh pressure mercury lamp as the alignment light.

Meanwhile, by using the exposure apparatus of this invention, an exposure pattern may be obtained on the wafer in the following method. That is, the wafer 9 preliminarily coated with photo resist (for example, novolak positive resist) is fixed on the XY wafer stage 8, and the XY wafer stage is controlled to match the positions of alignment keys 11 and 12 by using HeCd laser beam, i-line or j-line as the alignment light, and the excimer laser light source is operated to print the reticle pattern on the resist placed on the wafer.

While specific embodiments of the invention have been illustrated and described herein, it is realized that other modification and changes will occur to those skilled in the art. It is therefore to be understood that the appended claims are intended to cover all modifications and changes as fall within the true spirit and scope of the invention.

We claim:

1. An exposure apparatus for fabricating a semiconductor device from a wafer, said apparatus comprising:
   an XY wafer stage for supporting the wafer;
   an excimer laser means for emitting excimer laser light that travels along an optical path extending to the wafer supported on said stage whereby the wafer is exposed to the excimer laser light;
   a reticle stage for supporting a reticle in said optical path between said excimer laser means and the wafer;
   a reduction-projective lens disposed in said optical path and through which the excimer laser light passes before passing to the wafer; and
   an alignment optical system for facilitating an alignment of the reticle with the wafer,
   said alignment optical system including an alignment light source emitting alignment light having a wavelength of 300 nm~400 nm that travels along an optical path through the reticle to the wafer.

2. An exposure apparatus as claimed in claim 1, wherein said alignment light source comprises a superhigh pressure mercury lamp and the alignment light is the i-line or j-line of light emitted by said lamp.

3. An exposure apparatus as claimed in claim 1, wherein said alignment light source comprises an HeCd laser emitting HeCd laser light.

4. An exposure apparatus as claimed in claim 1, wherein the optical path along which the excimer laser light travels to the wafer is offset from the optical path along which the alignment light travels to the wafer.

5. A reduction-projective exposure apparatus for fabricating semiconductor devices, said apparatus comprising:
   an XY wafer stage;
   a wafer from which a semiconductor device is fabricated supported by said XY wafer stage;
   an excimer exposure light source for emitting excimer light that travels along an optical path extending to said wafer supported on said XY wafer stage whereby an exposure process occurs in which said wafer is exposed to the excimer light;
   a reticle stage;
   a reticle supported by said reticle stage in said optical path between said excimer light source and said wafer;
   a reduction-projective lens disposed in said optical path and through which the excimer light passes before passing to said wafer; and
   an alignment optical system for facilitating an alignment of said reticle with said wafer;
   said alignment optical system including an alignment light source emitting alignment light having a wavelength of 300 nm~400 nm that travels along an optical path through said reticle and to said wafer.

6. An exposure apparatus as claimed in claim 5, wherein said alignment optical system includes an alignment key on said reticle and an alignment key on said wafer.

7. An exposure apparatus as claimed in claim 5 wherein said wafer has a positive resist layer thereon.

8. An exposure apparatus as claimed in claim 5, wherein said resist layer includes a base polymer of a compound having the formula

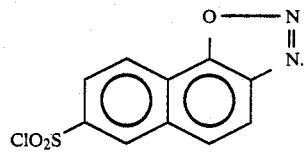

9. An exposure apparatus as claimed in claim 5, wherein said resist layer includes a base polymer of a compound having the formula

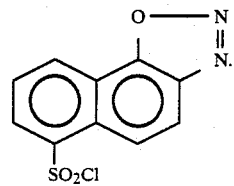

10. An exposure apparatus as claimed in claim 5, wherein said resist layer includes a base polymer of a compound of the formula

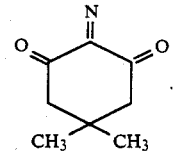

* * * * *